United States Patent
Meno et al.

[19]

[11] Patent Number: 5,124,570

[45] Date of Patent: Jun. 23, 1992

[54] OUTPUT CONTROL CIRCUIT

[75] Inventors: Fumio Meno, Hiji; Michiroh Kobayashi, Beppu, both of Japan

[73] Assignee: Texas Instruments Incorporated, Dallas, Tex.

[21] Appl. No.: 579,119

[22] Filed: Sep. 7, 1990

[30] Foreign Application Priority Data

Sep. 29, 1989 [JP] Japan ............................ 1-256475

[51] Int. Cl.⁵ .......................................... H03K 5/153
[52] U.S. Cl. .................................. 307/263; 307/270; 307/300
[58] Field of Search ............... 307/263, 270, 300, 456

[56] References Cited

U.S. PATENT DOCUMENTS

| | | | |
|---|---|---|---|
| 4,346,312 | 8/1982 | Christopherson | 307/300 X |
| 4,549,095 | 10/1985 | Stefani et al. | 307/270 X |
| 4,947,055 | 8/1990 | Shekhawat et al. | 307/263 X |

*Primary Examiner*—James B. Mullins
*Attorney, Agent, or Firm*—William E. Hiller; Richard L. Donaldson

[57] ABSTRACT

An output control circuit in which the rise and fall times of the output (slew rate) can be properly set respectively, because an electric charge control circuit part is provided to charge or discharge the electric charge to a control electrode of a second switching element at the rise or fall time of the output, and because each operation of the electric charge control circuit part corresponding to the rise and fall of the output is performed independently of the other.

7 Claims, 9 Drawing Sheets

OUTPUT CONTROL CIRCUIT

BACKGROUND OF THE INVENTION

1. Field of the Invention

This invention relates to output control circuits.

2. Description of the Prior Art

Conventionally, an IC (integrated circuit) generally called a line driver is commonly known as a drive circuit for driving a logic circuit in a following step or for driving signal (transmission) lines themselves, wherein the line driver IC for driving the above signal (transmission) lines is usually used as an interface IC in order to drive a coaxial cable or the like connecting, for example, a computer and each device (apparatus) such as a peripheral device thereof or the like. An example of such a line driver IC (for example, SN75ALS126 of Texas Instruments Incorporated) is illustrated in FIGS. 8 to 11.

Figure 8:
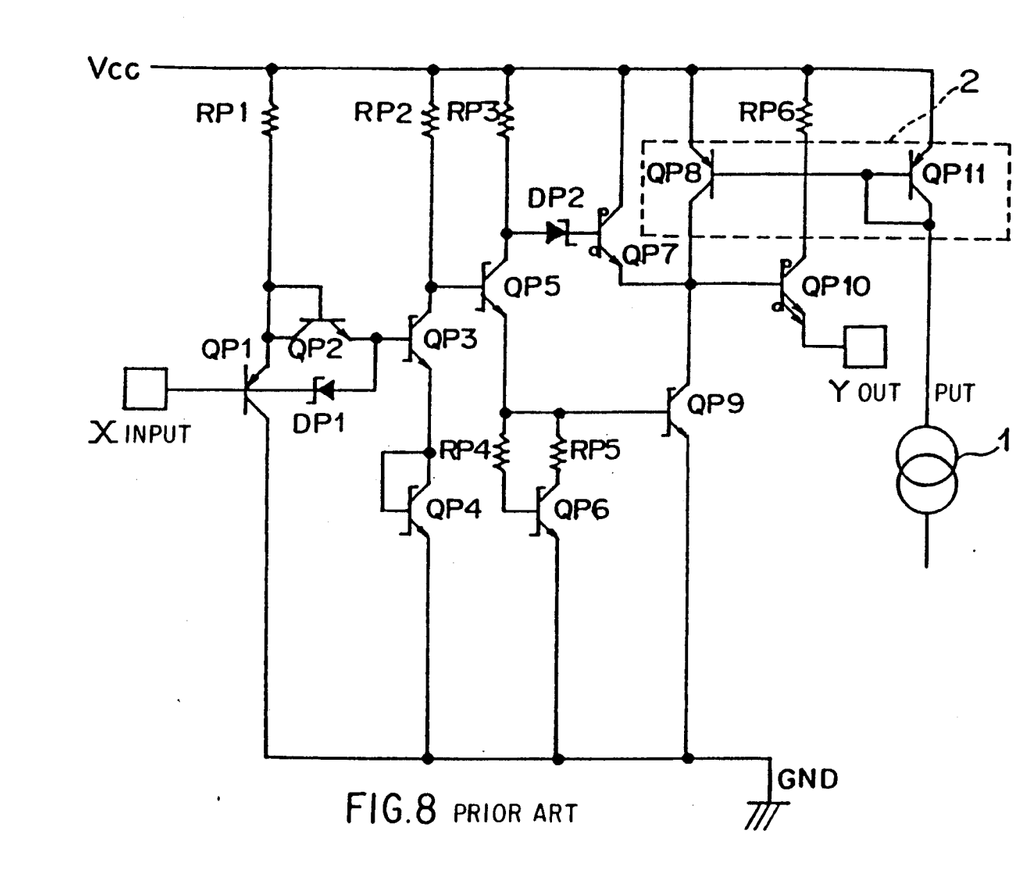
FIG. 8 is an equivalent circuit diagram showing the internal circuit components of a prior line driver.

First, an equivalent circuit diagram of the above line driver IC is shown in FIG. 8 to illustrate the connections of each internal circuit element. In this figure, however, only main circuit components are shown for the purpose of illustration; a short circuit protection circuit or the like at the output, for example, is not shown (the same in following examples). Also, a constant current circuit is shown simplified (the same in following examples).

As shown in the figure, the base of an input (PNP) transistor QP1 is connected to an X input terminal (for example, receiving the output of a bipolar type integrated circuit, which is not shown, in a previous step); the emitter thereof is connected through a resistor RP1 to a power supply $V_{CC}$; the collector thereof is connected to ground GND; and the base and the collector of an NPN transistor QP2 are further connected to the emitter of the transistor QP1. A Schottky diode DP1 (the anode is connected to the emitter of the transistor QP2, and the cathode is connected to the base of the transistor QP1) is connected between the emitter of the transistor QP2 and the base of the transistor QP1.

The base of an NPN transistor QP3 is connected to the emitter of the transistor QP2 and to the anode of the Schottky diode DP1; the collector thereof is connected through a resistor RP2 to the power supply $V_{CC}$ and to the base of an NPN transistor QP5; and the emitter thereof is connected to the base and the collector of an NPN transistor QP4. The emitter of the transistor QP4 is connected to the ground GND.

The collector of a transistor QP5 is connected through a resistor RP3 to the power supply $V_{CC}$ and through a Schottky diode DP2 (the anode is connected to the collector of the transistor QP5, and the cathode is connected to the base of an NPN transistor QP7) to the base of an NPN transistor Q7 (which has a guard ring and is clamped by a Schottky barrier diode (SBD) between the collector and the base); the emitter of the transistor QP5 is connected through a resistor RP4 to the base of a transistor QP6 and through a resistor RP 5 to the collector of the transistor QP6; and the emitter of the transistor QP6 is further connected to the ground GND.

The collector of the transistor QP7 is connected to the power supply $V_{CC}$; the emitter thereof is connected to the collector of a PNP transistor QP8, to the base of an NPN output transistor QP10 (which has a guard ring and is clamped by a Schottky barrier diode (SBD) between the collector and the base), and to the collector of an NPN transistor QP9, respectively. The emitter of the transistor QP8 is connected to the power supply $V_{CC}$; the base thereof is connected to the base and the collector of a PNP transistor QP11; and the emitter of the transistor QP11 is connected to the power supply $V_{CC}$. The base of the transistor QP9 is connected to the emitter of the transistor QP5, and the emitter of the transistor QP9 is connected to the ground GND.

The collector of the output transistor QP10 is connected through a resistor RP6 to the power supply $V_{CC}$, and the emitter thereof is connected to a Y output terminal (which is, for example, connected to a bipolar type integrated circuit, not shown in the figure, in a following step). A constant current circuit 1 is connected to the collector of the transistor QP11.

With regard to the operation of each element in FIG. 8, the input transistor QP1 is a transistor to reduce $I_{IL}$ ($I_{IL} = (V_{CC} - V_{BE(QP1)} - V_{IL})/(RP1 \times hfe_{(QP1)})$): the "L" level input current, however $V_{BE(QP1)}$ is the voltage between the base and the emitter of the transistor QP1, and $V_{IL}$ is the "L" level input voltage, and $hfe_{(QP1)}$ is the current amplification factor of the transistor QP1); QP2 is a transistor for adjusting $V_T$ (threshold voltage); QP3 is a transistor for internal buffers for a non-inverter; QP4 is a transistor for adjusting $V_T$; QP5 is a phase splitter for taking out a signal, which is in an opposite phase to a base signal, from the emitter side of QP5; QP6 is a transistor called active pull-down for improving the response characteristic of the transistor QP9, as a "Baker clamping circuit" which improves the ON/OFF characteristic of QP6; QP7 and QP8 are transistors for driving the output transistor QP10, QP9 is a transistor for pulling out the base electric charge of the output transistor QP10; QP11 is a transistor to constitute a circuit 2, called a current mirror, by being paired with the transistor QP8, in order to flow the current set in the constant current circuit 1 to the transistor QP8; the Schottky diode DP1 is for pulling out the base electric charge of the transistor QP3; and the Schottky diode DP2 is for adjusting $V_{OH}$ (the "H" level output voltage).

With regard to FIG. 8, the main operation will be described below. The operation as a whole is non-inverted, and when the input is the "L" level, the output is also the "L" level, and when the input is the "H" level, the output is also the "H" level.

First, in the case of the X input changing from the "L" level to the "H" level, when the X input is larger than $V_{BE(QP2)} + V_{BE(QP3)} + V_{BE(QP4)} - V_{BE(QP1)}$ (about 1.3 V in this example), it switches to the "H" level state, and the input transistor QP1 turns off (the state of the "H" level being in the base). The transistor QP2 turns on when the base thereof is switched to the "H" level by the power supply $V_{CC}$ through the resistor RP1. Moreover, the transistor QP3 turns on because the base thereof is at the "H" level through the transistor QP2; the transistor QP4 also turns on when the base thereof is switched to the "H" level by the power supply $V_{CC}$ through the resistor RP2 and the transistor QP3. Therefore, the transistor QP5 turns off when the base thereof switches to the "L" level through the transistors QP3 and QP4. At this time, the transistors QP6 and QP9 are off.

The transistor QP7 turns on when the base thereof is switched to the "H" level by the power supply $V_{CC}$ through the resistor RP3 and the diode DP2; the emitter current $I_{E(QP7)}$ of the transistor QP7 flows to the base of the output transistor QP10. Also with the transistor QP9 turned off, the collector current $I_{C(QP8)}$ of the transistor QP8 also flows to the base of the transistor QP10. Therefore, the output transistor QP10 turns on when the base thereof switches to the "H" level; the Y output (the emitter of the transistor QP10) is switched to the "H" level by the power supply $V_{CC}$ through the resistor RP6. However, the transistor QP7 is cut off when $V_{OH}$ (the "H" level output voltage) becomes $V_{OH} = V_{CC} - (V_{F(DF2)} + V_{BE(QP7)} + V_{BE(QP10)})$ ($V_F$, however, is the voltage drop of the Schottky diode). Thus, the transistor QP10 thereafter turns on only by the current ($I_C$) of the transistor QP8.

Next, in the case of the X input changing from the "H" level to the "L" level, the operation may be opposite to the above. That is, when the X input is smaller than $V_{BE(QP2)} + V_{BE(QP3)} + V_{BE(QP4)} - V_{BE(QP1)}$ (about 1.3 V in this example), it switches to the "L" level state, and the input transistor QP1 turns on (the state of the "L" level being in the base). Contrary to the above operation, the transistors QP2, QP3 and QP4 each turn off, and the transistors QP5, QP6, QP7 and QP9 each turn on.

Therefore, with the transistor QP9 passing the current (that is, $I_{C(QP8)}$) of the transistor QP8 to the ground GND and pulling out the base electric charge (that is, the base current $I_{B(QP10)}$) of the transistor QP10, the transistor QP10 turns off, and the Y output (the emitter of the transistor QP10) switches to the "L" level.

The above described line driver has a very excellent performance in a high speed operation or the like, but various examinations by the inventors show that there is more room for improvement, which will be described below.

Generally, in packaging high speed logic ICs or the like, noise in signal lines or the like must be taken into account; otherwise, circuits may not operate normally because of alternating current noise such as reflection noise, cross talk noise, or the like in signal transmission lines. Depending on the characteristic impedance of the signal transmission paths, the amplitude (size) of the noise, although different, is generally proportional to the signal amplitude and inversely proportional to the rise time (tr) and the fall time (tf) of the output; thus, although the operation in internal circuits of the above line driver or the like is at a high speed, the slew rate (the maximum time change rate of the output voltage) at the output thereof has to be small.

With regard to the slew rate at the output in FIG. 8 described above, the slew rate at the output depends greatly on the characteristics of chiefly the resistor RP3 and the transistors QP5, QP7, QP9 and QP10, which are mostly determined by process conditions in fabrication. That is, with the circuit as in FIG. 8 constituted by using the latest miniaturizing process especially for high speed operation, low power consumption or the like, the switching operation of each element is performed inevitably at a high speed.

At the rise time of the output, as described above, a rising waveform of the output is obtained by passing the currents $I_{E(QP7)}$ and $I_{C(QP8)}$ ($I_E$ is the emitter current, and $I_C$ is the collector current) of the transistors QP7 and QP8 respectively to the base of the output transistor QP10; at this time, taking the control of the slew rate into consideration, the rise time tr may be adjusted by setting the resistor RP3 and the constant current value of the constant current circuit 1 in the circuit shown in FIG. 8. At the fall time of the output, however, as described above, a falling waveform of the output is obtained by pulling out the base electric charge of the output transistor QP10 by the transistor QP9, but the current which flows from the transistor QP9 is $I_{C(QP8)} + I_{B(QP10)}$ ($I_B$ is the base current), in which the parameter to control the fall time tf is only $I_{B(QP10)}$. The discharge of $I_{B(QP10)}$ by the transistor being on is simply like a switch being on adjustment of tf to be suitable is significantly difficult. Even if such a difficult adjustment is performed, the set value of the resistor RP3 or the constant current circuit 1 is restricted, causing a problem such that simultaneous setting of tr and tf to a suitable value in the circuit of this example is impossible.

Figure 9:
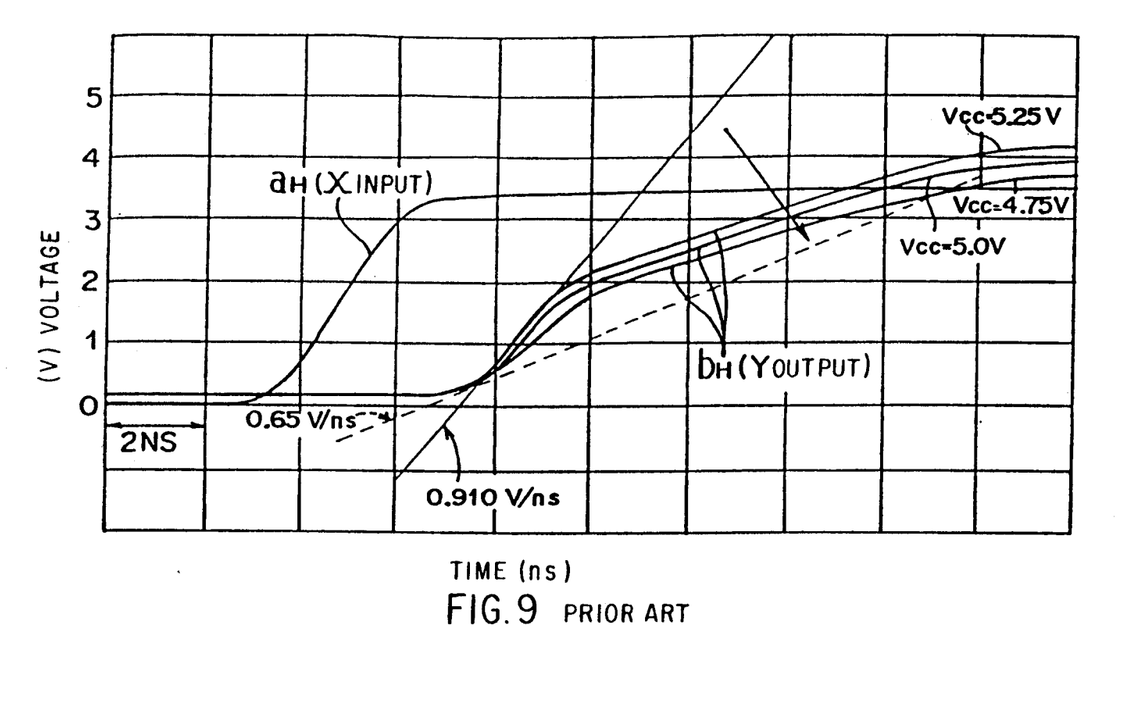
FIG. 9 shows a voltage-time characteristic showing a rising waveform of the output in the embodiment of FIG. 8.
Figure 10:
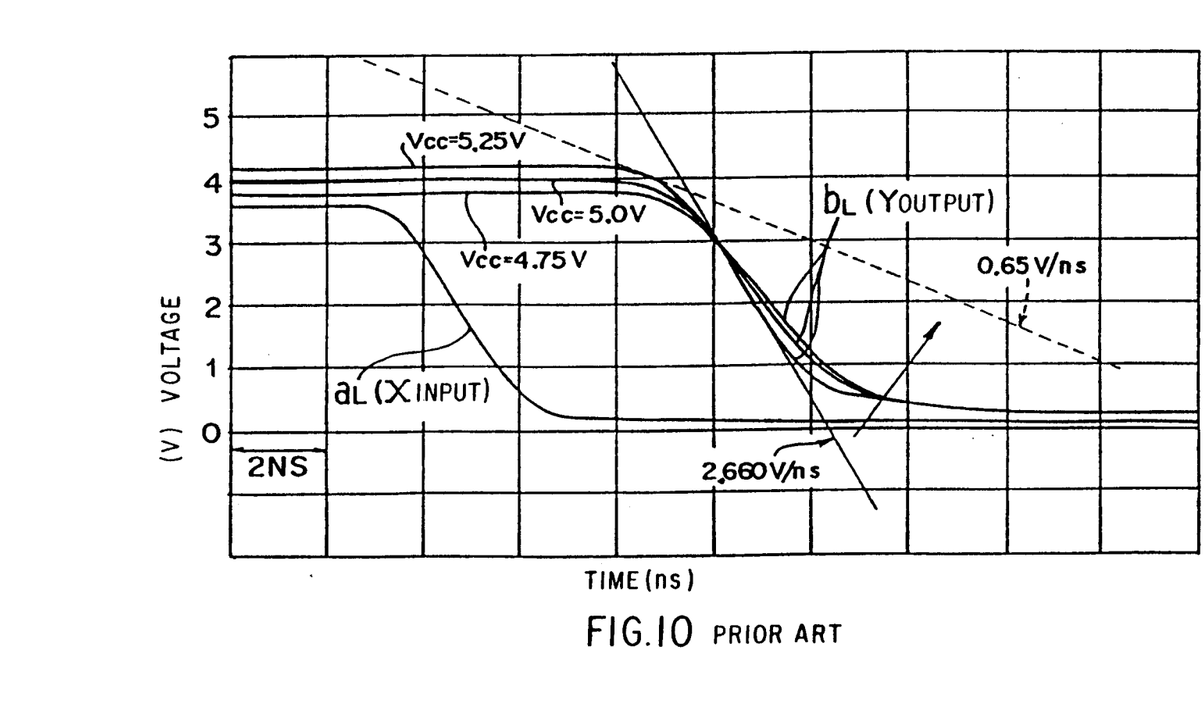
FIG. 10 shows a voltage-time characteristic showing a falling waveform of the output in the embodiment of FIG. 8.

Actually, the output waveforms in the rise and fall times of the output in FIG. 8 are like what are shown by the curves $b_H$ and $b_L$ in FIGS. 9 and 10 respectively ($a_H$ and $a_L$ in the figures are an X input waveform respectively in the rise and fall times of the output). As shown in the figures, the slew rates at the rise and fall times are respectively 0.910 V/nsec and 2.660 V/nsec; however, in comparison with, for example, the slew rate standard 0.65 V/nsec (the maximum slew rate at the rise and fall times of the output, shown in broken lines in the figures) defined as the signal transmission speed 4.5 Mbps version standard in a computer system, these rates are proven to be too large (this causes a false operation as described above). The output waveforms $b_H$ and $b_L$ in FIGS. 9 and 10 are shown for three cases, each with the power supply voltage $V_{CC}$ being 5.25 (V), 5.0 (V), and 4.75 (V) respectively.

SUMMARY OF THE INVENTION

A purpose of the invention is to provide output control circuits which can properly set the rise and/or fall times (slew rate) at the output without any influence from inherent element characteristics or the like determined by fabrication processses or the like.

This invention relates to such output control circuits wherein a second switching element at the output (for example, a later described transistor Q13) operates by receiving a signal from a first switching element at the input (for example, a later described transistor Q1), wherein an electric charge control circuit part is provided to charge or discharge the electric charge to a control electrode of the above second switching element at the rise or fall time of the output, and wherein each operation of the above electric charge control circuit part corresponding to the rise and fall of the output may be performed independently of one another.

BRIEF DESCRIPTION OF THE DRAWINGS

FIGS. 1-7 show embodiments of the invention:

FIGS. 8-10 show prior art;

In reference numerals as shown in the figures:

| | |
|---|---|
| 1 | constant current circuit (reference current supply); |
| 13, 13' | electric charge control circuit part; |
| 13a, 13b | current mirror circuit; |
| Q1, Q2, Q3, Q4, Q5, Q6, Q7, Q8, Q9, Q10, Q11, Q12, Q13, Q14 Q1', Q2', Q3', Q4' Q5', Q6', Q7', Q8' | transistor; |
| D1, D2 | diode; |
| R1, R2, R3, R4, R5, R6, R7, R8, R1', R2', R3', R4', R5', R6', R7', R8' | resistor; |
| $V_{CC}$ | power supply; and |
| GND | ground. |

DESCRIPTION OF THE PREFERRED EMBODIMENTS

Hereinafter, embodiments of the invention will be described.

FIGS. 1-6 show an embodiment in which the invention is applied to a line driver.

Figure 1:
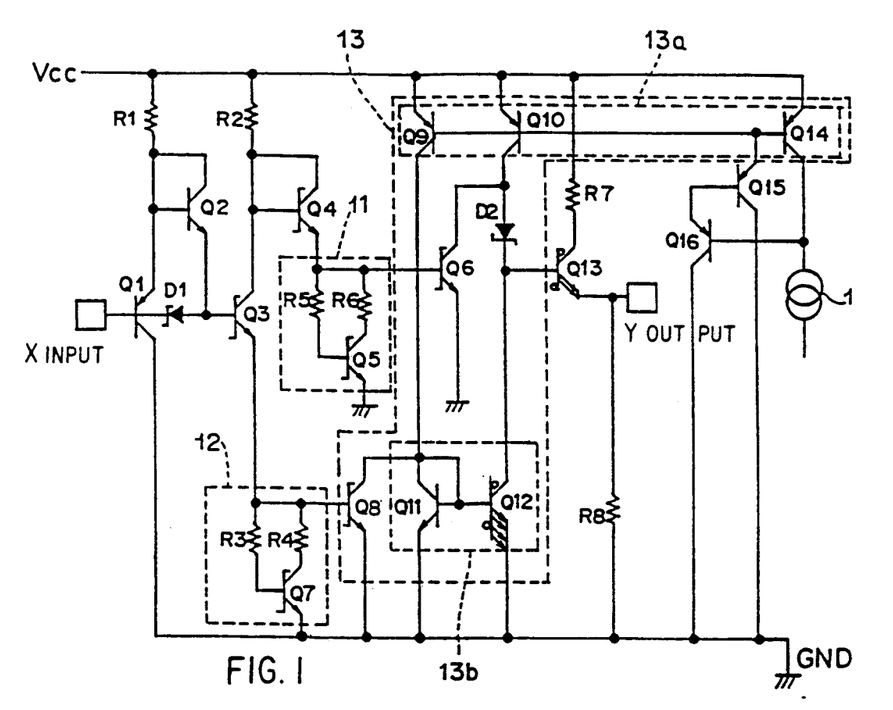
FIG. 1 is an equivalent circuit diagram showing an embodiment in which the invention is applied to a line driver.

First, with regard to the main circuit structure of a line driver of this embodiment in FIG. 1, the form of this circuit is a so-called open emitter form (a circuit form in which the output is an open emitter terminal); the base of an input transistor Q1 is connected to an X input terminal (which, for example, receives the output of a bipolar integrated circuit, not shown in the figure, in a previous step); the emitter thereof is connected through a resistor R1 to a power supply $V_{CC}$; the collector thereof is connected to the ground GND; and the base and the collector of a transistor Q2 are each connected to the emitter of the transistor Q1. The emitter of the transistor Q2 is connected to the base of a transistor Q3; a Schottky diode D1 is connected between the base of the transistor Q1 and the base of the transistor Q3 (the anode is connected to the base of the transistor Q3, and the cathode is connected to the base of the transistor Q1, respectively).

The collector of the transistor Q3 is connected through a resistor R2 to the power supply $V_{CC}$; the emitter thereof is respectively connected through resistors R3 and R4 to the base and the collector of a transistor Q7; and the emitter of the transistor Q7 is connected to the ground GND. The base and the collector of a transistor Q4 are each connected to the collector of the transistor Q3; the emitter thereof is respectively connected through resistors R5 and R6 to the base and the collector of a transistor Q5; and the emitter of the transistor Q5 is connected to the ground GND.

The base of a transistor QB is connected to the emitter of the transistor Q3; the collector thereof is respectively connected to the collector and the base of a transistor Q11; and the emitter thereof is connected to the ground GND. The base of the transistor Q11 is connected to the base of a transistor Q12 (which has a guard ring and is clamped by a Schottky barrier diode); the emitters of the transistors Q11 and Q12 are respectively connected to the ground GND; and the collector of the transistor Q12 is connected to the base of an output transistor Q13 (which has a guard ring and is clamped by a Schottky barrier diode).

The base of a transistor Q6 is connected with the emitter of the transistor Q4; the collector of the transistor Q6 is connected to the collector of a transistor Q10; and the emitter thereof is connected to the ground GND. The emitter of a transistor Q9 is connected to the power supply $V_{CC}$; the base thereof is connected to the bases of the transistors Q10 and Q14; the collector thereof is connected to the collector of the transistor Q11; the emitter of the transistor Q10 is connected to the power supply $V_{CC}$; and the collector thereof is connected through a Schottky diode D2 (the anode is connected to the collector of the transistor Q10, and the cathode is connected to the base of the transistor Q13) to the base of the output transistor Q13.

The collector of the output transistor Q13 is connected through a resistor R7 to the power supply $V_{CC}$; the emitter thereof is connected through a Y output terminal (which is, for example, connected to a bipolar integrated circuit, now shown in the figure, in a following step) and an end terminal resistor R8 to the ground GND. The emitter of the transistor Q14 is connected to the power supply $V_{CC}$; the collector thereof is respectively connected to the base of a transistor Q16 and to a constant current circuit 1; the emitter of the transistor Q16 is connected to the base of a transistor Q15; the collector thereof is connected to the ground GND; the emitter of the transistor Q15 is connected to the base of the transistor Q14; and the collector thereof is connected to the ground GND.

With regard to the operation of each circuit element in this embodiment, the transistors Q1, Q2 and Q13 and the Schottky diode D1 operate similarly and correspond to the transistors QP1, QP2 and QP10 and the Schottky diode DP1 in FIG. 8 as above described; the transistors Q10 and Q12 also operate similarly to the transistors QP8 and QP9 in FIG. 8 respectively. With regard to other circuit elements, the transistor Q3 is a phase splitter for controlling the transistors Q6 and Q8; the transistor Q4 is a transistor for supplying current to the transistors Q5 and Q6 by turning on when the transistor Q3 is off; the transistors Q5 and Q7, along with resistors R3, R4, R5 and R6, respectively constitute active pull-down circuits 11 and 12 which speed up respective transistors Q6 and Q8 to be turned off by pulling out the base electric charge of each transistor, in order to improve the compliance with the DC (direct current) signal change; the transistor Q6 is a transistor which, when turned on, absorbs the collector current of the transistor Q10 in order not to supply the current to the base of the transistor Q13; and the transistor Q8 is a transistor which, when turned on, absorbs the collector current of the transistor Q11 in order to stop the operation of a current mirror circuit formed by the transistors Q11 and Q12.

The transistors Q9, Q10 and Q14 are so called local constant current supplies which constitute a current mirror circuit 13a to pass the current multiplied by the ratio of the standard current, according to the ratio of the emitter area of the transistor Q14; the transistors Q11 and Q12 constitute a current mirror circuit 13b, as above described, to supply a constant current. (In this case, the transistor Q12 passes about four times as much current as the collector current $I_{C(Q9)}$ of the transistor Q9. The reason is that a current which is twice as much as the collector current $I_{C(Q9)}$ of the transistor Q9 (the emitter area of the transistor Q12 / the emitter area of the transistor Q11) is the collector current $I_{C(Q12)}$ of the transistor Q12 in this case because the current which passes in a current mirror circuit is usually proportional to an emitter area.) The transistors Q15 and Q16, along with the transistor Q14, via a three-step Darlington connection serve to compensate for the low current amplitude ratio hfe of a horizontal type PNP transistor. The Schottky diode D2 is for preventing the current from the base of the transistor Q13 from passing into the transistor Q6, when the transistor Q6 turns on.

As described above, an electric charge control circuit part 13, which includes the current mirror circuits 13a and 13b, the transistors Q6 and Q8, and the Schottky diode D2 for charging and discharging the electric charge, is connected to the base of the output transistor Q13.

Next, the operation of the line driver of this embodiment will be described below with reference to FIGS. 2 and 3. With regard to the operation as a whole, as described above, when the input is the "L" level, the output is also the "L" level, and when the input is the "H" level, the output is also the "H" level.

Figure 2:
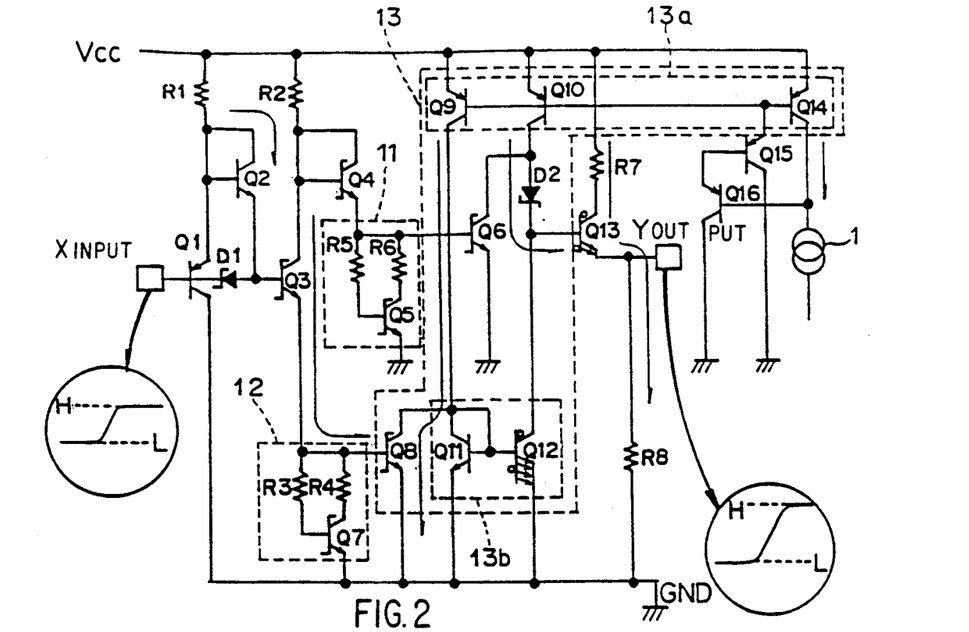
FIG. 2 is an equivalent circuit diagram to illustrate the operation at the rise time of the output in the embodiment of FIG. 1.

First, as shown in FIG. 2, in the case of the X input changing from the "L" level to the "H" level, the input transistor Q1 turns off at the moment the X input switches to the "H" level; the transistor Q2 turns on when the base thereof is switched to the "H" level by the power supply $V_{CC}$ through the resistor R1. The transistor Q3 turns on when the base thereof is switched to the "H" level by the transistor Q2 (that is, by the current, shown by an arrow in the figure, passing into the base of the transistor Q3); and the transistor Q8 turns on when the base thereof is switched to the "H" level by the transistor Q3 (that is, by the current, shown by an arrow in the figure, passing into the base of the transistor Q8). Therefore, at this time, because the transistor Q8 is on, the transistors Q11 and Q12, constituting the current mirror circuit 13b, are turned off by the current of the transistor Q9, shown by an arrow in the figure, passing through the transistor Q8 (that is, bypassing the collector current $I_{C(Q11)}$ of the transistor Q11).

Also, as described above, because the transistor Q3 turns on to pass the current by the power supply $V_{CC}$ through the resistor R2 to the base of the transistor Q8, the transistor Q4 turns off, and further the transistor Q6 turns off. Thus, as shown by an arrow in the figure, the collector current (constant current) $I_{C(Q10)}$ of the transistor Q10 in the current mirror circuit 13a passes through the Schottky diode D2 to the base of the output transistor Q13 (that is, the electric charge is charged to the base of the transistor Q13 by the transistor Q10), and then transistor Q13 turns on. As a result, by the power supply $V_{CC}$ through the resistor R7, the current shown by an arrow in the figure is passed through the transistor Q13 to the pull down resistor R8, and thus the Y output switches to the "H" level.

In this case, as described above, charging of the electric charge to the base of the output transistor Q13 may be performed only by the transistor Q10.

Figure 3:
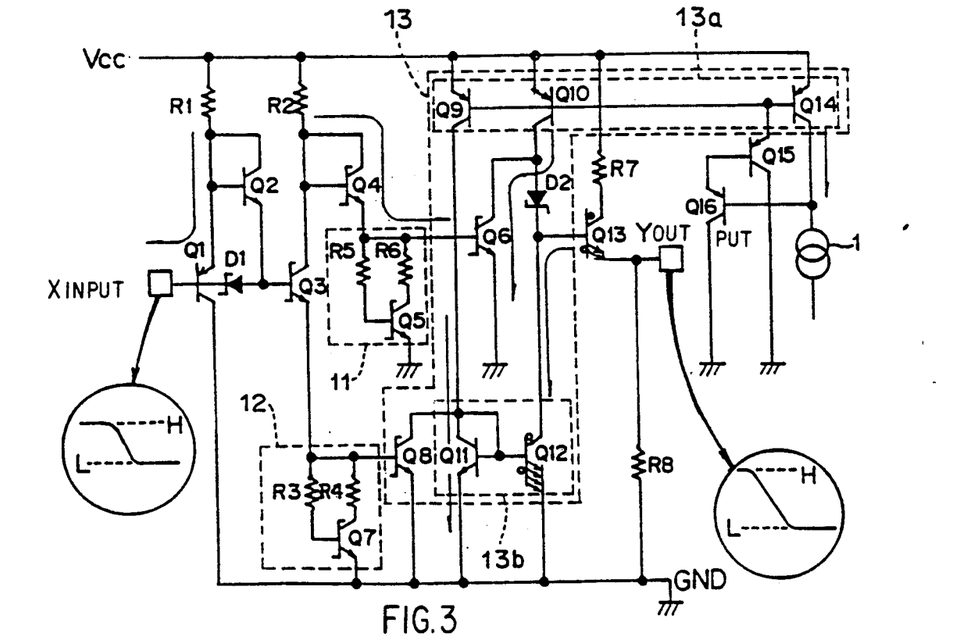
FIG. 3 is an equivalent circuit diagram to illustrate the operation at the fall time of the output in the embodiment of FIG. 1.

Next, as shown in FIG. 3, in the case of the X input changing from the "H" level to the "L" level, because the input transistor Q1 turns on at the moment the X input switches to the "L" level, the current (that is, the emitter current $I_{E(Q1)}$ of the transistor Q1) is passed by the power supply $V_{CC}$ through the resistor R1 to the X input terminal, as shown by an arrow in the figure. Thus, the transistor Q2 (the base being at the "L" level) turns off, and further the transistor Q3 turns off. Because the transistor Q3 is off, the transistor Q4 turns on when the base thereof is switched to the "H" level by the power supply $V_{CC}$, and the current shown by an arrow in the figure flows to the base of the transistor Q6. Therefore, at this time, because the transistor Q6 turns on when the base thereof switches to the "H" level, the collector current $I_{C(Q10)}$ of the transistor Q10 in the current mirror circuit 13a is all passed to the ground GND.

Because the transistor Q3 turns off, the transistor Q8 also turns off; hence, the transistor Q8 does not bypass the collector current $I_{C(Q11)}$ of the transistor Q11 in the current mirror circuit 13b, as described above. Thus, the transistor Q11 turns on when the current of the transistor Q9 in the current mirror circuit 13a passes into the base thereof, allowing the collector current $I_{C(Q11)}$ shown by an arrow in the figure to flow.

The collector current (constant current) $I_{C(Q11)}$ flows when the transistor Q11 of the current mirror circuit 13b turns on; therefore, the collector current (constant current) $I_{C(Q12)}$ shown by an arrow in the figure also flows to the transistor Q12 similarly. That is, the base electric charge of the output transistor Q13 is gradually pulled out by the transistor Q12 as the collector current $I_{C(Q12)}$ thereof, to turn the transistor Q13 off. When the output transistor Q13 turns off, the end terminal resistor R8 operates as a pull-down resistor, and the Y output switches to the "L" level.

The output transistor Q13 does not suddenly turn off, since the base electric charge thereof will not be pulled out because of the Schottky diode D2 (which is in the inverse bias condition), even if the transistor Q6 turns on. The pulling out of the base electric charge of the transistor Q13 may be performed only by the transistor Q12, as described above.

According to the invention, as described hereinabove, the electric charge control circuit part 13 is provided to charge or discharge the electric charge to the base of the output transistor Q13 at the rise or fall time of the output (Y output), and each operation of the electric charge control circuit part 13 corresponding to the rise and fall of the output is performed independently of the other (that is, as described above, charging the electric charge to the base of the output transistor Q13 only by the collector current $I_{C(Q10)}$ of the transistor Q10 in the electric charge control circuit part 13 at the rise time of the output, and discharging the base electric charge of the output transistor Q13 only by the collector current $I_{C(Q12)}$ of the transistor Q12 in the electric charge control circuit part 13 at the fall time of the output), so that the rise and fall times (slew rate) of the output may be properly controlled. As a result, reflection noise, cross talk noise, or the like may be prevented.

Also in the embodiment, as described above, the collector current $I_{C(Q10)}$ of the transistor Q10 and the collector current $I_{C(Q12)}$ of the transistor Q12 are made to be a constant current by the current mirror circuits 13a and 13b respectively, so that output waveforms of the rise and fall of the output (Y output) are linear, which is favorable to the invention. With $A_E$ being the emitter area, the respective collector currents $I_C$ of the transistors Q10 and Q12 in the current mirror circuits 13a and 13b are shown below:

$$I_{C(Q10)} = \frac{A_{E(Q10)}}{A_{E(Q14)}} \times I_{C(Q14)}$$

$$I_{C(Q12)} = \frac{A_{E(Q12)}}{A_{E(Q11)}} \times \frac{A_{E(Q9)}}{A_{E(Q14)}} \times I_{C(Q14)}$$

Figure 4:
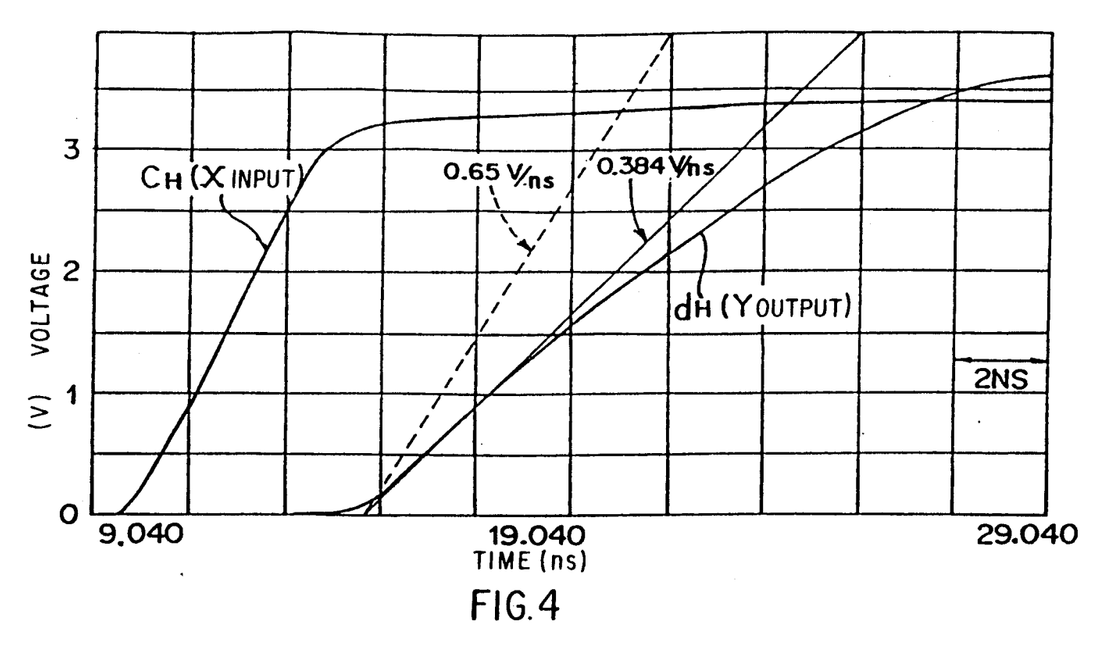
FIG. 4 shows a voltage-time characteristic showing a rising waveform of the output in the embodiment of FIG. 1.
Figure 5:
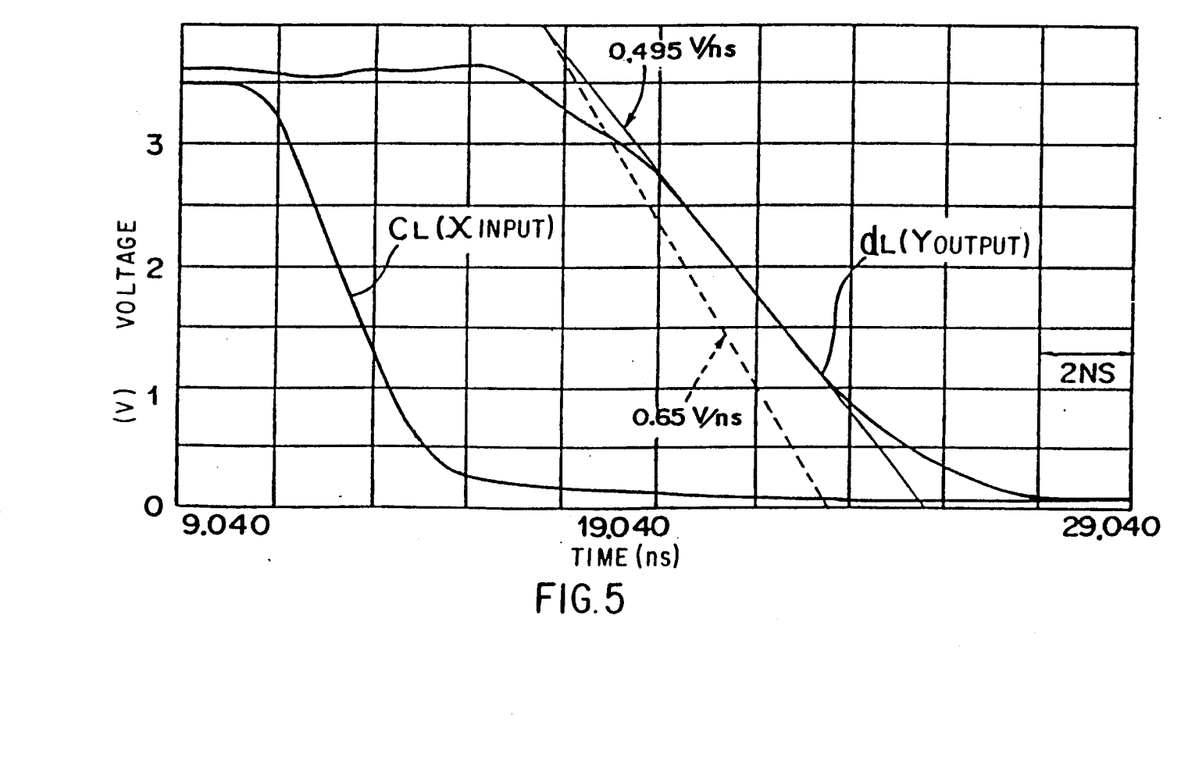
FIG. 5 shows a voltage-time characteristic showing a falling waveform of the output in the embodiment of FIG. 1.

With each ratio decided, the precision of each constant current is determined by $I_{C(Q14)}$. Thus, in order to be sufficiently stable for changes in temperature, $V_{CC}$, or the like, attention has to be paid only to the reference current supply 1, allowing more flexibility in design. Actual output waveforms at the rise and fall times of the output in the embodiment are shown by the curves $d_H$ and $d_L$ in FIGS. 4 and 5 respectively (the curves $C_H$ and $C_L$ in the FIGS. are X input waveforms at the rise and fall times of the output respectively). As seen in the figures, the slew rates at the rise and fall times of the output are respectively 0.384 V/nsec and 0.495 V/nsec, which can be seen to be significantly smaller (the rise and fall times being slower) than the ones of the embodiment in FIG. 8. Thus, as shown in FIGS. 4 and 5, the values of the output slew rates in this embodiment are sufficiently smaller than the value of the slew rate, 0.65 V/nsec, (this value is the standard value which is set by the above computer system) shown by broken lines in the figures.

Figure 6:
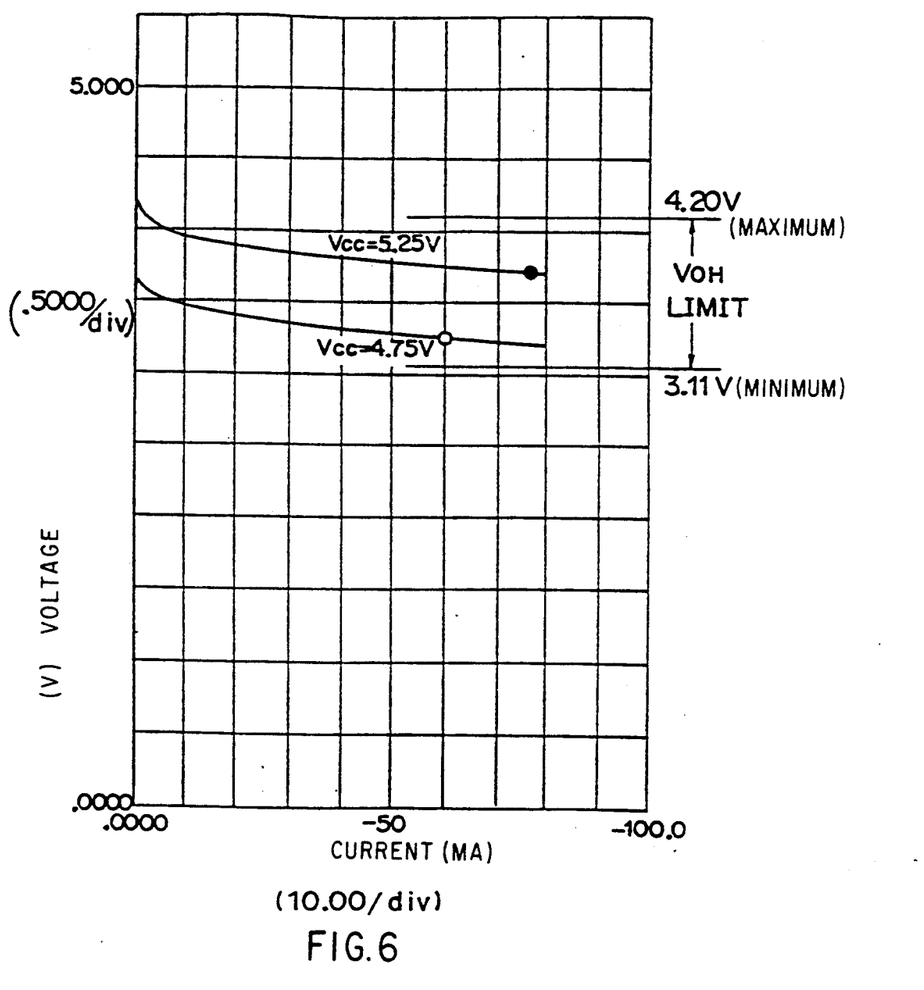
FIG. 6 shows a voltage-current characteristic to illustrate the "H" level output voltage margin in the embodiment of FIG. 1.

Also in this example, as shown in FIG. 6, the value of the "H" level output voltage $V_{OH}$ is 3.69 V with $V_{CC}$ being 5.25 (V) and the "H" level output current $I_{OH}$ being −76.2 (mA), and enough margin can be seen for the standard maximum value, 4.10 V, of $V_{OH}$. Also, the value of $V_{OH}$ is 3.23 V with $V_{CC}$ being 4.75 (V) and $I_{OH}$ being −59.3 (mA), and enough margin can be seen also for the standard minimum value, 3.11 V, of $V_{OH}$. The value of $V_{OH}$ may be changed by the value of the forward voltage $V_F$ of the diode D2 (that is, although not shown, $V_{OH}$ of the output may be changed by, for example, using only proper numbers of diode D2 in series, or by using a PN junction diode, or the like).

In this embodiment, $V_{OH}$ is determined by $V_{OH} = V_{CC} - V_{BE(Q13)} - V_{F(D2)} - V_{CE(Q10)}$, in which $V_{BE(Q13)}$ equals 0.6 to 0.7 (V), $V_{CE(Q10)}$ equals 0.1 to 0.2 (V), and $V_{F(D2)}$ equals 0.5 to 0.6 (V). Although $V_{BE(Q13)}$ and $V_{CE(Q10)}$ may not easily be changed because of their great influence on the other parameters, the diode D2 may be changed because it only controls the current flow.

For example, with $V_{BE(Q13)}$ being 0.6 (V), $V_{CE(Q10)}$ being 0.1 (V), and $V_{F(D2)}$ being 0.5 (V), $V_{OH}$ equals 3.8 (V) when $V_{CC}$ equals 5.0 (V). $V_{OH}$ can be 3.3 (V) by making the diode D2 in two-steps when $V_{OH}$ needs to be reduced; $V_{OH}$ can be 3.6 (V) with $V_F$ being 0.7 (V) by making the diode D2 a PN diode, when there is no need to reduce so much. $V_{OH}$ may be subtly controlled by utilizing the fact that $V_F$ is basically inversely logarithmically proportional to the diode junction area.

Figure 7:
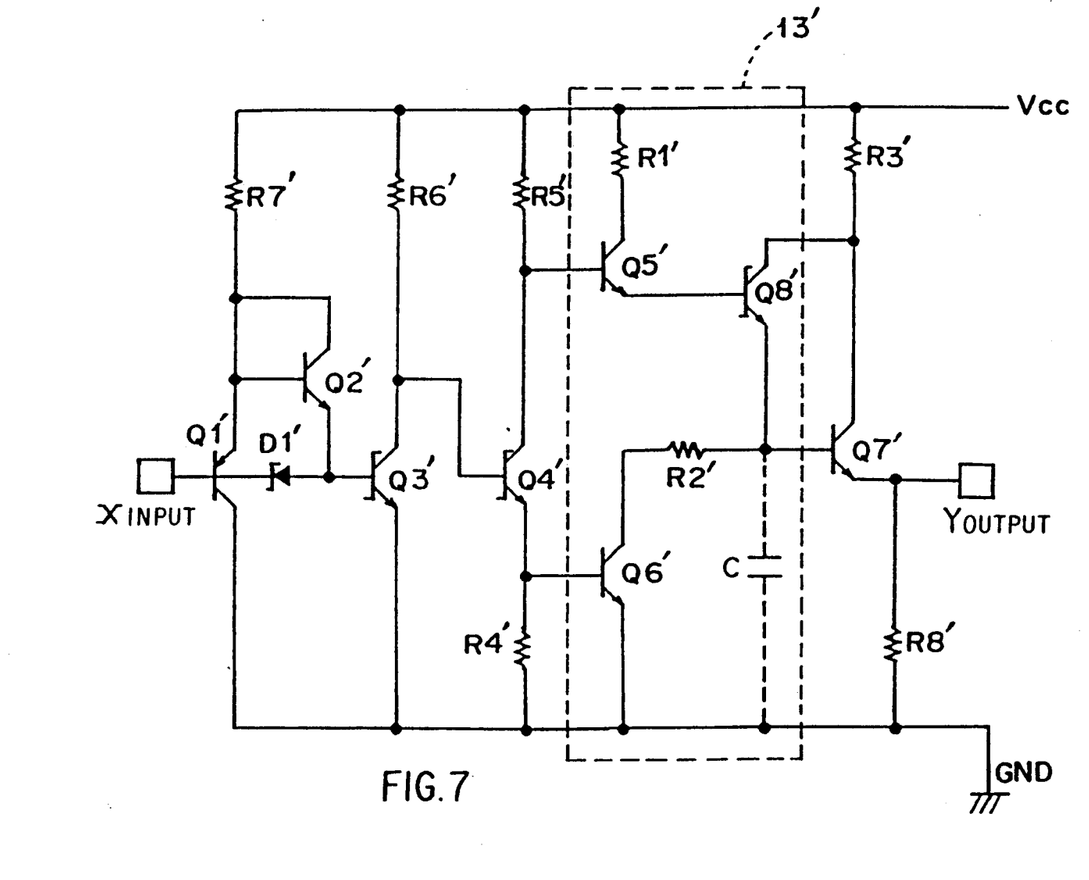
FIG. 7 is an equivalent circuit diagram showing another embodiment of the invention.

FIG. 7 shows another embodiment of the invention.

This is the simplest circuit, in which Q5' turns on, passing the current from $V_{CC}$ through R1' to the base of Q7' to turn Q7' on, when the output changes from L to H, although the operation principle from an input X to an output Y is omitted. At this time, R1' contributes greatly to the rise time (tr). When the output changes from H to L, the fall time (tf) is determined by the time constant of CR2, with Q5' being off, Q6' being on, and the parasitic capacity of the base of Q7' being C. Because the values of R1' and R2' contribute greatly to tr and tf, the slew rate of the output can be controlled similarly to the above embodiment by properly setting the vlaues of the resistors.

Although embodiments of the invention have been illustrated and described, these embodiments may be changed based on the technical idea of the invention.

For example, although an NPN transistor is used as the output transistor in the above embodiments, a PNP transistor may also be used; in this case, the operation of charging and discharging of the electric charge will be oppopsite to the embodiments as described. Other switching elements, resistors, or the like may be appropriately changed; circuit elements may not necessarily are bipolar transistors but may be comprised of, for example, MOS transistors or the like.

Each circuit structure in the above electric charge control circuit part may be variously changed. Although the invention has been applied to the line driver in the above embodiments, it may be also applied to receivers or various high logic circuits such as TTLs or the like

EFFECTS OF THE INVENTION

This invention, as described above, can provide output control circuits which can properly set the rise and fall times of the output (slew rate) respectively, because an electric charge control circuit part is provided to charge or discharge the electric charge to a control electrode of a second switching element (for example, the output transistor Q13) at the rise or fall time of the output, and because each operation of the above electric charge control circuit part corresponding to the rise and fall of the output is performed independently of the other.

What is claimed is:

1. A line driver integrated circuit having an output signal control of the maximum time rate change of the output voltage providing a relatively small slew rate independent of the characteristics of the electronic components of the line driver circuit, said line driver circuit comprising:
    means for receiving an input signal having a magnitude varying from a "low" level to a "high" level, said input signal-receiving means including a first switching element;
    output means operably connected to said input signal-receiving means and including a second switching element having a control electrode;
    an electric charge control circuit interposed between said first switching element of said input signal-receiving means and said second switching element of said ouput means and respectively electrically connected thereto for alternately charging and discharging electric charge to and from said control electrode of said second switching element in response to the rise and fall of the signal as output from said first switching element, said electric charge control circuit comprising:
        a first current mirror circuit for supplying a constant current, a second current mirror circuit connected to the output of the first current mirror circuit, first and second control transistors connected to said first switching element and respectively operably connected to said first and second current mirror circuits; and an electronic component interposed between said first and second current mirror circuits and connected to the control electrode of said second switching element to prevent the control electrode of said second switching element from passing current to said first control transistor when said first control transistor is rendered conductive from the signal as output from said first switching element; and the respective operations of the electric charge control circuit corresponding to the rise and fall of the signal as output from said first switching element being performable independently of each other.

2. A line driver integrated circuit as set forth in claim 1, wherein said electronic component is a Schottky diode.

3. A line driver integrated circuit as set forth in claim 1, wherein said first current mirror circuit of said electric charge control circuit comprises a first plurality of bipolar transistors connected to a power supply;

said second current mirror circuit of said electric charge control circuit comprises a second plurality of bipolar transistors connected to ground; and the output of one of said second plurality of bipolar transistors of said second current mirror circuit being connected to the control electrode of said second switching element.

4. A line driver integrated circuit as set forth in claim 3, wherein said first and second switching elements are respectively first and second bipolar switching transistors.

5. A line driver integrated circuit as set forth in claim 4, wherein said first bipolar switching transistor is a PNP transistor and said second bipolar switching transistor is an NPN transistor.

6. A line driver integrated circuit as set forth in claim 4, wherein said second bipolar switching transistor is provided with a guard ring and is clamped by a Schottky barrier diode.

7. A line driver integrated circuit as set forth in claim 6, wherein said one of said second plurality of bipolar transistors of said second current mirror circuit is provided with a guard ring and is clamped by a Schottky barrier diode.

* * * * *